United States Patent [19]

Panther

[11] Patent Number: 4,769,588

[45] Date of Patent: Sep. 6, 1988

[54] APPARATUS AND METHOD FOR PROVIDING A CURRENT EXPONENTIALLY PROPORTIONAL TO VOLTAGE AND DIRECTLY PROPORTIONAL TO TEMPERATURE

[75] Inventor: Gyles Panther, Stittsville, Canada

[73] Assignee: Digital Equipment Corporation, Maynard, Mass.

[21] Appl. No.: 93,396

[22] Filed: Sep. 4, 1987

[51] Int. Cl.[4] .......................... G05F 1/44; H03G 3/20

[52] U.S. Cl. .................................... 323/280; 323/316; 323/907; 330/254; 330/256; 330/278; 330/293

[58] Field of Search ........ 323/275, 279, 280, 313-316, 323/907; 363/63; 330/254, 256, 257, 278, 279, 289, 291, 293

[56] References Cited

U.S. PATENT DOCUMENTS 3,805,145 4/1974 Gordon .............................. 323/280
4,263,560 4/1981 Ricker ................................ 330/279
4,333,056 6/1982 Cave .................................. 330/279

OTHER PUBLICATIONS

R. D. Gillingham, "Differential Amplifier with DC Restore", IBM Technical Disclosure Bulletin, vol. 23, No. 9, Feb. 1981, pp. 4042-4043.

"A Monolithic Analog Exponential Converter", by J. H. Huijsing and J. Anne van Steenwijk, IEEE Journal of Solid-14 State Circuits, vol. SC-15, No. 2, pp. 162-168 (Apr. 1980).

*Primary Examiner*—Peter S. Wong
*Attorney, Agent, or Firm*—Kenyon & Kenyon

[57] ABSTRACT

An apparatus and method for providing a current exponentially proportional to voltage and directly proportional to temperature is disclosed. An output current is provided that is exponentially proportional to amplifier output voltage and directly proportional to temperature for automatic gain control. The output current is applied to an amplifier for varying gain.

11 Claims, 2 Drawing Sheets

APPARATUS AND METHOD FOR PROVIDING A CURRENT EXPONENTIALLY PROPORTIONAL TO VOLTAGE AND DIRECTLY PROPORTIONAL TO TEMPERATURE

BACKGROUND OF THE INVENTION

The present invention relates to the field of analog signal processing. In particular, this invention relates to an apparatus and a method for providing a current exponentially proportional to voltage and directly proportional to temperature. Such an apparatus and method can be used in an automatic gain control system.

Automatic gain control ("AGC") is a process or means by which gain is adjusted automatically in a specified manner as a function of input or other parameters. It is well known that the gain of variable gain amplifiers can be so adjusted or varied. Automatic gain control can be implemented in a known way by means of an electrical feedback loop from the output of an amplifier to the gain control input of the amplifier.

A known variable gain amplifier includes two parts: (1) an exponential converter that converts a control voltage to a current that is a function of the logarithm of the control voltage, and (2) an amplifier that has a gain that is a function of the current out of the exponential converter. A monolithic analog exponential voltage-to-current converter based on the exponential characteristic of bipolar transistors is described in an article entitled *A Monolithic Analog Exponential Converter* by J.H. Huijsing and J. Anne van Steenwijk in IEEE Journal of Solid-State Circuits, Vol. SC-15, No. 2, pp. 162–68 (April 1980).

Both of the above-mentioned parts of a variable gain amplifier (i.e., the exponential converter and the amplifier) have temperature coefficients that alone are undesirable.

SUMMARY AND OBJECTS OF THE INVENTION

In view of the above background, one of the objects of the present invention is to provide an apparatus and method for achieving a substantially temperature-invariant gain characteristic for an automatic gain control loop.

Another object of the present invention is to provide an exponential converter apparatus with a temperature characteristic that will substantially cancel a temperature characteristic of an amplifier.

A further object of the present invention is to provide an exponential converter apparatus for providing a current exponentially proportional to voltage and directly proportional to temperature.

Another object of this invention is to provide an apparatus and method for providing a current exponentially proportional to voltage and directly proportional to temperature for automatic gain control.

A further object of this invention is to provide an exponential converter apparatus with a specific transfer function wherein current varies exponentially with voltage and wherein current varies linearly with temperature.

Yet another object of the present invention is to provide an exponential converter apparatus for providing a current exponentially proportional to voltage and directly proportional to temperature, and that minimizes the dissipation of power.

A further object of the present invention is to provide an exponential converter apparatus for providing a current exponentially proportional to temperature for use on an integrated circuit chip.

These and other objects of the present invention are provided by an exponential converter apparatus comprising input means for receiving a voltage, means for generating an output current that is exponentially proportional to the voltage applied to the input means and that is directly proportional to temperature, and output means for providing the output current.

The above-mentioned objects and other objects of the present invention are also provided for by a method of automatic gain control comprising the steps of generating an amplifier output voltage, sensing the amplifier output voltage and generating a sensing output voltage in response to the amplifier output voltage, and generating an output current for input into the amplifier for varying gain, the output current being exponentially proportional to the sensing output voltage and being directly proportional to temperature.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
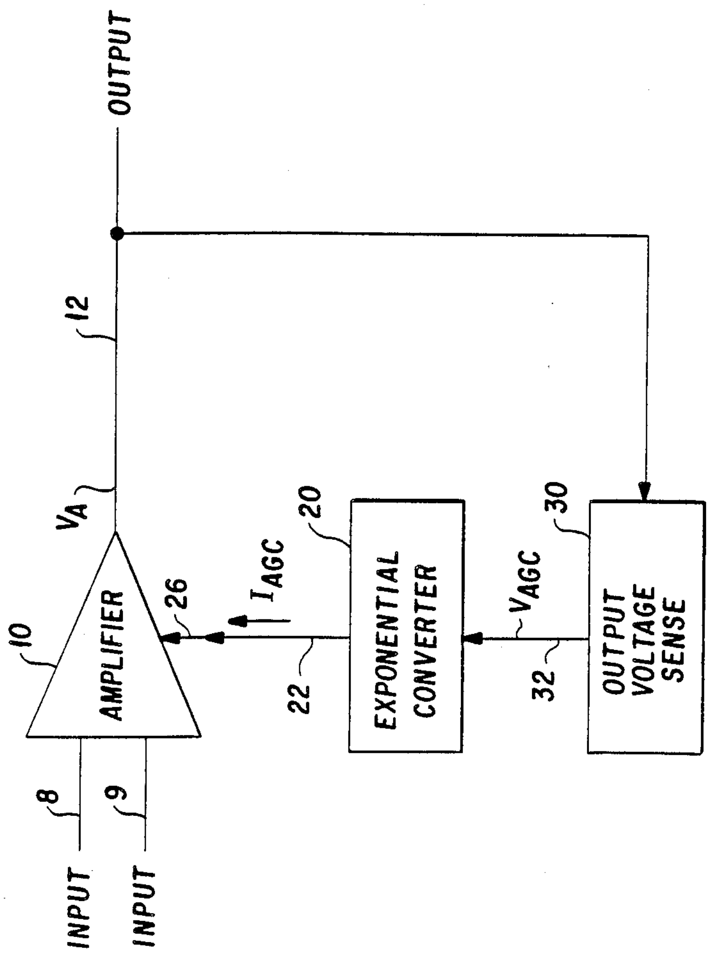
FIG. 1 is a block diagram of one embodiment of an automatic gain control apparatus according to the present invention.

With reference to the drawings, FIG. 1 illustrates in block diagram form an automatic gain control apparatus. Amplifier 10 is a differential amplifier with inputs 8 and 9 and an output 12. Amplifier 10 amplifies a differential input voltage provided across inputs 8 and 9 and generates amplifier output voltage $V_A$.

In other embodiments of the present invention, amplifier 10 could have a single input or two outputs. In addition, amplifier 10 could alternatively be an operational amplifier. Moreover, in alternative embodiments, two or more amplifiers in series or stages could be substituted for amplifier 10.

Amplifier output 12 is fed into output voltage sense stage 30. Output voltage sense stage 30 senses, measures, or detects the level or presence of voltage $V_A$ on amplifier output 12. Output voltage sense stage 30 generates a sensing output voltage $V_{AGC}$ (also referred to as automatic gain control voltage $V_{AGC}$) and applies it to output 32. Preferably, output voltage sense 30 is a full wave rectifier.

Output 32 of output voltage sense 30 is fed into exponential converter 20. Exponential converter circuit 20 (also referred to as exponentiator 20 or exponential circuit 20) generates an output curent $I_{AGC}$ (also referred to as automatic gain control current $I_{AGC}$) on output 22 such that output current $I_{AGC}$ is exponentially proportional to the automatic gain control voltage $V_{AGC}$ and, furthermore, is directly proportional to temperature.

Output 22 of exponentiator 20 is fed into input 26 of amplifier 10, and thus automatic gain current $I_{AGC}$ is fed into amplifier 10. A variation in automatic gain current $I_{AGC}$ causes a variation in the gain of amplifier 10.

The automatic gain control apparatus illustrated in FIG. 1 could be used to control gain to keep amplifier output voltage $V_A$ substantially constant despite variations of input voltage (over a range) across inputs 8 and 9. Such variations in input voltage across inputs 8 and 9 could result, for example, from the signal from a magnetic read head (not shown).

Figure 2:
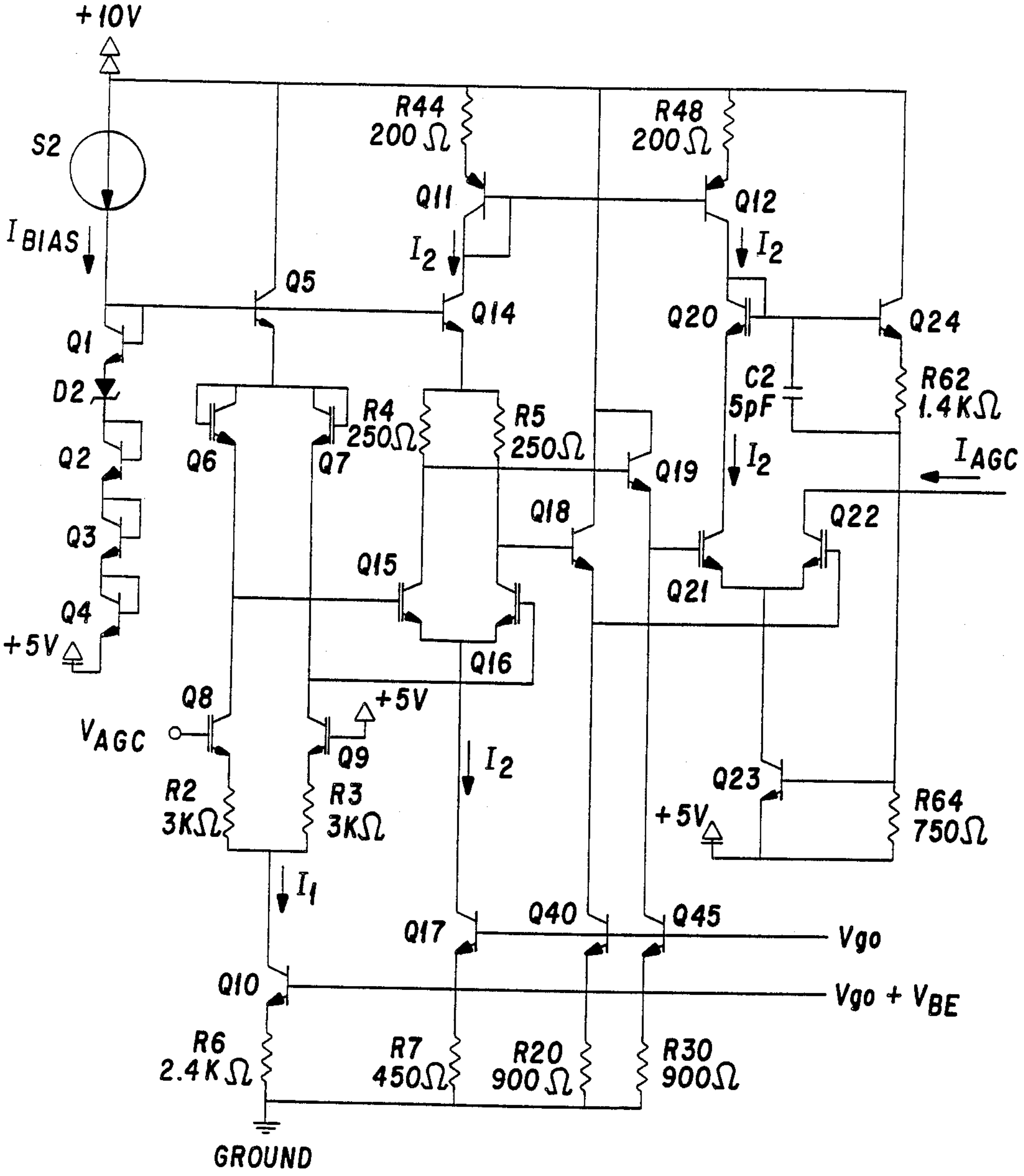
FIG. 2 is a schematic diagram of an exponential converter apparatus for providing a current exponentially proportional to voltage and directly proportional to temperature.

FIG. 2 illustrates in schematic form the exponential converter 20 of FIG. 1. Automatic gain control voltage $V_{AGC}$ is fed into the base of transistor Q8. The exponential converter 20 has a specific transfer function associated with it. The value of automatic gain control current $I_{AGC}$ flowing through the collector of transistor Q22 is substantially determined by that transfer function. For exponential circuit 20, that transfer function is:

$$I_{AGS}=M\cdot T\cdot e^{-X\cdot V_{AGC}}.$$

$I_{AGC}$ is the automatic gain control current, M is a constant, T is the junction temperature of transistor Q17, e is the base of natural logarithms, X is a constant, and $V_{AGC}$ is the automatic gain control voltage. Thus, the automatic gain control output current $I_{AGC}$ of exponential converter 20 is exponentially proportional to the automatic gain control input voltage $V_{AGC}$ of exponential circuit 20.

The above transfer function associated with exponential converter 20 results from the specific circuit implementation.

The band gap voltage $V_{go}$ applied to the exponential converter 20 is a temperature-compensated voltage that remains substantially constant over a range of temperature variation. Preferably, the value of $V_{go}$ is chosen to be 1.22 volts, which is the extrapolated band gap voltage of silicon at zero degrees Kelvin. The sum of band gap voltage $V_{go}$ and base-emitter voltage $V_{BE}$ is applied to the base of transistor Q10. (Voltage $V_{BE}$ is derived from a transistor that matches transistor Q10). That results in voltage $V_{go}$ being applied across resistor R6, and current $I_1$ being generated. Voltage $V_{go}$ and the resistance of resistor R6 are substantially constant over a temperature range, so current $I_1$ is therefore substantially constant.

Band gap voltage $V_{go}$ is also supplied to the bases of transistors Q17, Q40, and Q45. Given that transistor Q17 has a base-emitter voltage drop, a voltage $V_{go}$ minus base-emitter voltage $V_{BE}$ of transistor Q17 appears across resistor R7. The base emitter voltage $V_{BE}$ of transistor Q17 varies with variations in junction temperature of transistor Q17, and $V_{go}$ and the resistance of resistor R7 are substantially constant with changes in temperature. Therefore, current $I_2$ through R7 varies with and is proportional to the junction temperature of transistor Q17.

The transfer function prior to reduction for exponential circuit 20 is as follows:

$$I_{AGC}=(7.5)\cdot I_2\cdot e^{\left[\frac{-q}{k\cdot t}\cdot\left(\frac{re6}{R2}\cdot\frac{R4}{re15}\right)\cdot VAGC\right]}.$$

$I_{AGC}$ is the automatic gain control current. The factor "7.5" in the equation comes from the fact that transistor Q22 is 7.5 times the size of transistor Q21. $I_2$ is the current through the collector-emitter of transistor Q17. The term $-q$ is the value of electric charge, which is $1.603\times10^{-19}$ coulombs. The letter "k" is Boltzmann's constant, which is $1.38\times10^{-23}$ J° $K^{-1}$, where J is joules and ° $K^{-1}$ is degrees Kelvin to the minus one. "T" is temperature in degrees Kelvin. re6 is the small signal resistance of transistor Q6 and re15 is the small signal resistance of transistor Q15. R2 and R4 are the resistance values of resistors R2 and R4, respectively. A further relationship is that:

$$re=\frac{k\cdot T}{q\cdot(IE)},$$

where "IE" is the bias current of the particular trarsistor referenced by the "re" parameter.

In deriving the above transfer equation for exponential converter 20, it was assumed that re8—the small signal resistance of transistor Q8—is much smaller than the resistance of resistor R2. In deriving the transfer equation for exponential circuit 20, it was also assumed that base currents are negligible. The above transfer equation thus is a first order approximation and ignores second order effects in the circuit. The transfer function is substantially valid over the range of $V_{AGC}$ from 0 V to 800 mV.

The transfer function reduces as follows. Resistors R2 and R4 have approximately the same temperature coefficients, so the ratio of R4 to R2 is substantially independent of temperature. As discussed above, current $I_1$ is substantially temperature independent.

The transistor bias current IE6 for transistor Q6 is proportional to current $I_1$, so therefore current IE6 is substantially temperature independent. Thus, all the temperature dependent terms in the expression $-q/(k\cdot T)$ cancel with all the temperature dependent terms in the re6 expression of $k\cdot T/(q\cdot(IE6))$.

The bias current IE15 for transistor Q15 is proportional to current $I_2$, and thus IE15 is proportional to temperature. Thus the temperature dependent terms in the numerator and the denominator of $k\cdot T/(q\cdot IE)$ cancel, meaning that parameter re15 is independent of temperature.

As discussed above, current $I_2$ is directly proportional to temperature, so the transfer function reduces to:

$$I_{AGC}=M\cdot T\cdot e^{-(X\cdot V_{AGC})}.$$

wherein "M" is a constant and "X" is a constant. Thus, current IAGC is directly proportional to temperature, and exponentially proportional to $V_{AGC}$.

Preferably, biasing is set up so that $I2=(4)\cdot I_1$. Thus, re6 would then equal four times re15, and the transfer function would reduce to:

$$I_{AGC}=(7.5)\cdot(I_2)\cdot e^{\left[\frac{-4q}{k\cdot t}\cdot\frac{R4}{R2}\cdot VAGC\right]}.$$

One can easily adjust the ratio R4/R2 to obtain the desired input voltage range. The preferred embodiment gives a twenty-five times current variation within a 500 mV $V_{AGC}$ range.

The maximum gain setting of amplifier 10 of FIG. 1 occurs at $V_{AGC}=0$ when $I_{AGC}=(7.5)\cdot I_2=7.5$ mA. With respect to minimum gain, $V_{AGC}=500$ mv and IAGC=300 microamperes correspond to the minimum gain setting. Returning to FIG. 2, the relationship of the circuit is further described as follows. Each stage of the exponential converter 20 has its own specific transfer function. Q8 and Q9 are a differential pair of transistors in a differential stage having a linear transfer function. The resistance of R2 equals the resistance of R3. Transistors Q8 and Q9 are coupled to diode loads Q6 and Q7 which are non-linear.

Q15 and Q16 are a differential pair of transistors in a differential stage having a non-linear transfer function. The voltage from the differential stage containing transistors Q8 and Q9 is applied to the differential stage containing transistors Q15 and Q16.

In this embodiment the pre-distortion technique is made use of, wherein a linear signal (i.e., from Q8 znd Q9) is fed to a stage with a non-linear characteristic (i.e., Q6 and Q7) that is complementary to the non-linear characteristic of the next stage (i.e., Q15 and Q16), resulting in the "cancellation" of the non-linear characteristics, yielding linear characteristics. Q21 and Q22 are a buffered pair of transistors, the collector current of Q22 being $I_{AGC}$.

The stack of diodes Q1, Q2, Q3, Q4 and Schottky diode D2 generates a convenient bias voltage for transistors Q5 and Q14 current source S2 provides current $I_{bias}$ for the stack of diodes.

Transistor Q5 generates a convenient bias point for transistors Q6 and Q7.

Transistors Q11 and Q12 comprise a PNP current mirror 18 that repeats current $I_2$ on the other side of the circuit.

Transistors Q24 and Q23 comprise a feedback loop for forcing current $I_2$ to run through transistor Q21. Capacitor C2 acts to stabilize the output stage feedback loop, comprised of transistors Q24, Q23, and Q21.

Transistors Q18 and Q19 are voltage followers for applying voltages from transistors Q15 and Q16 to transistors Q21 and Q22. Transistors Q18 and Q19 thus act as a buffer stage. Current source transistors Q40 and Q45 provide bias to transistors Q18 and Q19, respectively.

Q20 is a diode used to correct the balance with respect to transistor Q21 and to help to minimize second-order effects.

The supply voltages are a positive 10 volts, a positive 5 volts, and ground.

The characteristics of the first transistor in each of the following pairs should substantially match the characteristics of the other respective transistor in the pair: Q6-Q7, Q8-Q9, Q11-Q12, Q15-Q16, Q18-Q19, and Q21-Q22 (with Q22 being 7.5 times larger than Q21).

The exponential converter 20 can be contructed utilizing discrete semiconductor devices or embodied in a solid-state integrated circuit produced on a silicon or similar chip. On an integrated circuit chip, all the devices would be at substantially the same temperature.

In the foregoing specification, the invention has been described with reference to specific exemplary embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

What is claimed is:

1. An exponential converter apparatus comprising:
input means for receiving a voltage;
means for generating an output current that is exponentially proportional to the voltage applied to the input means and that is substantially directly proportional to temperature; and
output means for providing the output current.

2. The exponential converter apparatus recited in claim 1, wherein the output current is relate to the voltage applied to the input means by the following equation:

$$I = M \cdot T \cdot e^{-X \cdot V},$$

wherein I is the output current, M is a constant, T is temperature, e is a base of natural logarithms, X is a constant, and V is the voltage applied to the input means.

3. An automatic gain control apparatus comprising:
an amplifier having an output voltage;
means for sensing the amplifier output voltage and for generating a sensing output voltage in response to the amplifier output voltage; and
means for generating an output current for input into the amplifier for varying gain, the output current being substantially exponentially proportional to the output voltage of the sensing means and being substantially directly proportional to temperature.

4. The automatic gain control apparatus recited in claim 3, wherein the output current is related to the output voltage of the sensing means by the following equation:

$$I = M \cdot T \cdot e^{-X \cdot V},$$

wherein I is the output current, M is a constant, T is temperature, e is a base of natural logarithms, X is a constant, and V is the output voltage of the sensing means.

5. An exponential converter apparatus comprising:
a first pair of transistors, the first pair of transistors being coupled to input means;
a second pair of transistors, the second pair of tansistors being coupled to the first pair of transistors;
a third pair of transistors, the third pair of transistors being coupled to output means;
means for transferring voltage from the second pair of transistors to the third pair of transistors;
means for transferring current from the second pair of transistors to the third pair of transistors, wherein a voltage applied to the input means yields an output current that is substantially exponentially proportional to the input voltage and is substantially directly proportional to temperature.

6. The exponential converter apparatus recited in claim 5, wherein the output current is related to the input voltage by the following equation:

$$I = M \cdot T \cdot e^{-X \cdot V},$$

wherein I is the output current, M is a constant, T is temperature, e is a base of natural logarithms, X is a constant, and V is the input voltage.

7. The exponential converter apparatus apparatus recited in claim 5, wherein the first pair of transistors has a linear transfer function and the second pair of transistors has a non-linear transfer function.

8. The exponential converter apparatus recited in claim 7, wherein a non-linear diode load is coupled to the first pair of transistors.

9. The exponential converter apparatus recited in claim 8, wherein a current through the first pair of transistors is substantially constant with temperature and wherein a current through the second pair of transistors is substantially directly proportional to temperature.

10. A method for automatic gain control, comprising the steps of:

generating an amplifier output voltage;

sensing the amplifier output voltage and generating a sensing output voltage in response to the amplifier output voltage; and generating an output current for input into the amplifier for varying gain, the output current being substantially exponentially proportional to the sensing output voltage and being substantially directly proportional to temperature.

11. The method recited in claim 10 for automatic gain control, wherein the output current is related to the output voltage of the sensing means by the following equation:

$$I = M \cdot T \cdot e^{-X \cdot V},$$

wherein I is the output current, M is a constant, T is temperature, e is a base of natural logarithms, X is a constant, and V is the output voltage of the sensing means.

* * * * *